United States Patent
Roberts et al.

(10) Patent No.: US 6,256,592 B1
(45) Date of Patent: Jul. 3, 2001

(54) MULTI-ENDED FAULT LOCATION SYSTEM

(75) Inventors: Jeffrey B. Roberts, Viola, ID (US); Gabriel Benmouyal, Boucherville; Demetrios Tziouvaras, Vacaville, both of (CA)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 09/256,632

(22) Filed: Feb. 24, 1999

(51) Int. Cl.$^7$ ................................ G01R 31/00
(52) U.S. Cl. ................. 702/59; 702/58; 702/60; 324/512; 324/525
(58) Field of Search .............. 702/58–60, 185; 324/521–522, 512, 525; 361/79–81

(56) References Cited

U.S. PATENT DOCUMENTS

| | | | |
|---|---|---|---|
| 4,528,611 | * 7/1985 | Udren | 361/81 |
| 4,559,491 | * 12/1985 | Saha | 702/59 |
| 5,485,394 | * 1/1996 | Murata et al. | 702/59 |
| 5,825,189 | * 10/1998 | Johns | 702/59 |
| 6,148,267 | * 11/2000 | Premerlani | 702/58 |

OTHER PUBLICATIONS

Edmund O. Schweitzer III, "A Review of Impedance–Based Fault Locating Experience", Fourteenth Annual Iowa–Nebraska System Protection Seminar Oct. 16, 1990 (pp. 1–31).

Robert C. Bartz and Edmund O. Schweitzer III, "Field Experience with Fault Locating Relays", 13th Annual Western Protective Relay Conference Oct. 20, 1986, (pp. 1–15).

Edmund O. Schweitzer III, "Evaluation and Development of Transmission Line Fault Locating Techniques Which Use Sinusoidal Steady–State Information", Ninth Annual Western Protective Relay Conference, Oct. 26, 1982, (pp. 1–10).

T. Takagi et al, "Development of a New Type Fault Locator Using the One–Terminal Voltage and Current Data", IEEE Transactions on Power Apparatus and Systems, vol. PAS 101, No. 8, Aug. 1982, (pp. 2892–2898).

* cited by examiner

Primary Examiner—Kamini Shah
Assistant Examiner—Bryan Bui

(57) ABSTRACT

In a fault location system, selected information concerning the power signal is obtained at each terminal location on a multi-ended power line. Typically, protective relays are positioned at the terminal locations. The selected information includes the magnitude value of the negative sequence current and the magnitude and angle of the negative sequence impedance of the power signal, at approximately mid-fault in time. An automatic calculation circuit is provided for calculating from the negative sequence values a fractional value m of the total line length representing the point on the line where the fault has occurred, and a system for calculating the distance to the fault from the fault location calculation terminal using the value m and the total distance between the two terminals.

16 Claims, 5 Drawing Sheets

V₂F Calculated by Relays S and R For Each Iteration

| Iteration | $|V_{2F}|$ @ Relay S | $|V_{2F}|$ @ Relay R | Guess @ m | $\Delta V_{2F}$ |
|---|---|---|---|---|
| #1 | 0.073 V | 0.083 V | 0.500 | -0.010 V |
| #2 | 0.084 V | 0.069 V | 0.750 | 0.015 V |
| #3 | 0.078 V | 0.076 V | 0.625 | 0.003 V |
| #4 | 0.076 V | 0.080 V | 0.560 | -0.004 V |
| #5 | 0.077 V | 0.078 V | 0.590 | -0.001 V |
| #6 | 0.078 V | 0.077 V | 0.610 | 0.001 V |
| #7 | 0.078 V | 0.077 V | 0.600 | 0.000 V |

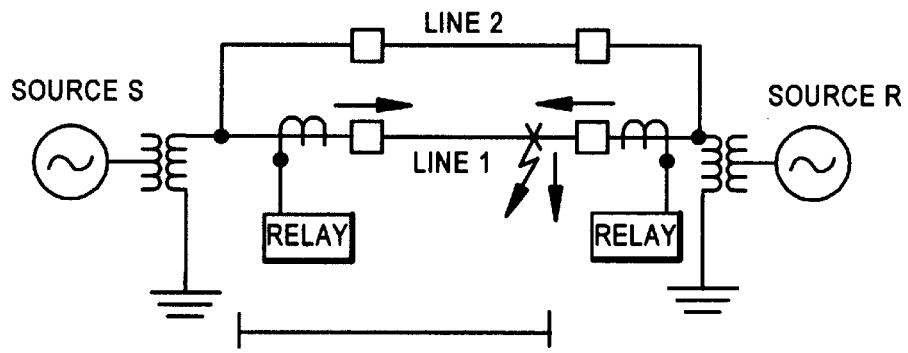

| | Pos.-Sequence | | Zero-Sequence |
|---|---|---|---|
| Source S: | $Z_{1S} = 1.00 \angle 90°$ [Ωsec] | $Z_{0S}$ | $= 8.85 \angle 88.10°$ [Ωsec] |
| Source R: | $Z_{1R} = 1.00 \angle 90°$ [Ωsec] | $Z_{0R}$ | $= 10.82 \angle 88.10°$ [Ω sec] |
| Line 1: | $Z_{1L1} = 1.00 \angle 90°$ [Ωsec] | $Z_{0L1}$ | $= 2.92 \angle 78.50°$ [Ω sec] |
| Line 2: | $Z_{1L2} = 1.00 \angle 90°$ [Ωsec] | $Z_{0L2}$ | $= 2.92 \angle 78.50°$ [Ω sec] |
| Zero-Seq. Mutual: | | $Z_{0M}$ | $= 0.7 \cdot Z_{0L1}$ |
| Fault Resistance: | | $R_F$ | $= 2$ [Ω sec] |
| Load Flow Angle (Source S to R w/R as Reference): | | $\delta$ | $= 0°$ (no load) |

FIG.4

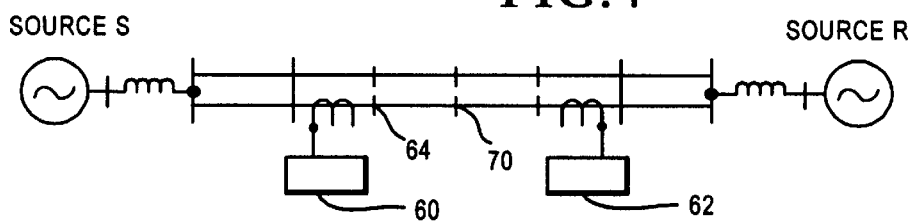

System Electrical Data (primary units):

| Source Data: | Zero-Seq. [Ω] | Positive-Seq. [Ω] | |
|---|---|---|---|
| SMLN5-MLN5 | 0.0 + j150.0 | 0.0 + j50.0 | |
| SVDX5-VDX5 | 0.0 + j30.0 | 0.0 + j20.0 | |
| Line Data: | Zero-Seq.[Ω/mile] | Positive-Seq. [Ω/mile] | Mutual: [Ω/mile] |
| Impedance | 0.299312 + j 1.92793 | 0.0302102 + j 0.656045 | 0.267432 + j 0.989963 |
| Susceptance | 5.09007E-06 S/mile | 6.65645E-06 S/mile | |
| MLN5 RMT5 | 25 miles of double-ckt 500 kV lines | | |
| TMT5 VDX5 | 25 miles of double-ckt 500 kV lines | | |
| RMT5 TMT5 | 100 miles of double-ckt 500 kV lines split into 4-sections of 25 mi. each | | |

FIG.5

DISTANCE TO FAULT

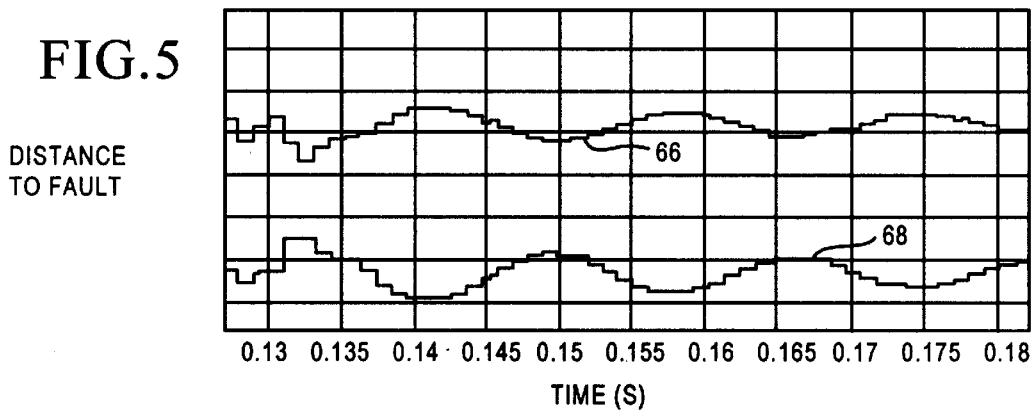

TIME (S)

FIG.6

DISTANCE TO FAULT

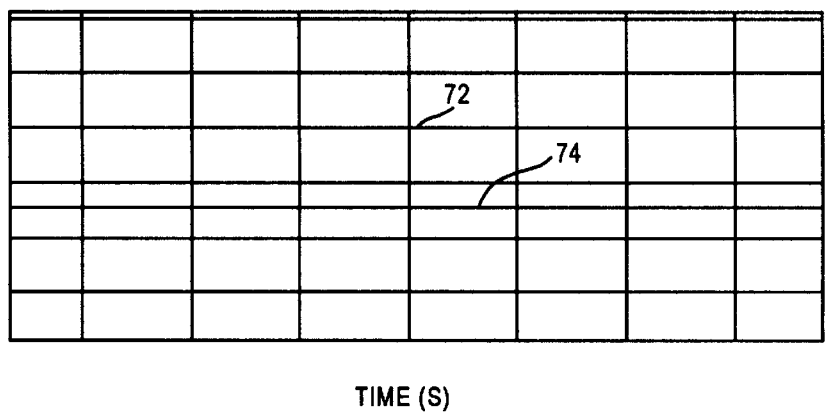

TIME (S)

MULTI-ENDED FAULT LOCATION SYSTEM

DESCRIPTION

1. Technical Field

This invention relates generally to fault location systems for electric power systems, and more particularly concerns double-ended or even multi-ended fault location systems.

2. Background of the Invention

Accurate calculated fault location information is important to the proper operation of an electric power system. The information can be used by the automatic protection system, as well as by system operators and the power system protection engineers. One significant aspect of power system operation affected by fault location concerns the time necessary to physically find the actual fault point along the power line. Another aspect involves reclosing performance after a circuit breaker has opened due to a fault.

Single-ended fault location, meaning fault location calculated from information provided by a single relay on a power line, has become a standard feature in most current microprocessor-based protective relays. Fault location capability is also offered as an option in many digital fault recorder systems as well. Single-ended fault location techniques, which typically use power line impedance-based calculations, are typically simple and fast and do not require communication with other terminal devices, such as a downstream relay, on the protected line.

However, it is well known that large errors in fault location results can occur with single-ended systems. The circumstances where such errors can occur include situations such as where there is strong zero sequence mutual coupling between adjacent lines, where the power system includes multiple remote terminals, including specifically three-terminal line situations, where there are large angle differences between the power sources feeding the line and the line itself, or where the power lines are non-transposed.

More specifically, there are typically two types of single-ended fault location systems, one using a reactance-based calculation method and the other using what is known as a Takagi-based calculation method. In the reactance method, the fault location system first measures the apparent impedance of the line and then ratios the reactance (the imaginary part) of the apparent impedance to the known reactance of the entire line. This ratio is in fact proportional to the distance to the fault from the single-ended terminal. The reactance method works reasonably well for homogeneous power systems where the fault does not involve significant fault resistance or load flow. The reactance calculations do not take into account or attempt to compensate for the errors which result in those situations involving significant fault resistance or load flow.

The Takagi method, as described in an article by T. Takagi et al, entitled "Development of a New Fault Locator Using the One Terminal Voltage and Current Data", IEEE Transaction on PAS, Vol. PAS-s101, No. 8, August 1982, pp. 2842–2898, does attempt to compensate for those specific sources of errors. The Takagi method, however, typically requires knowledge of pre-fault phase current for the faulted phase portion of the protected line. If the fault location calculation system does not have accurate pre-fault data, the fault location result is severely affected. Further, non-homogeneous power systems still result in errors in the fault location information. The amount of error depends upon the difference in system angle on either side of the fault, the magnitude of the fault resistance, and the direction of load flow. The error is most pronounced at high values of fault resistance. A comprehensive review of impedance-based fault location methods can be found in a paper by Edmund O. Schweitzer III, entitled "A Review of Impedance-Based Fault Locating Experience", presented at the Fourteenth Annual Iowa-Nebraska System Protection Seminar on October 16, 1990.

While compensation attempts for non-homogeneous system errors have been made, including "tilting" of the top line reactance characteristic calculation by a selected factor $e^{jT}$, where T is a setting equal to the angle of shift required for a particular fault location, this and other compensation techniques have not been very effective. The reactance tilting method, for instance, is valid for only one point on the protected line.

The basic difficulty with single-ended fault location methods is that they must compensate for not knowing the total current which flows through the fault resistance. The basic solution to that particular difficulty, however, is to have all of the relays which protect a particular line communicate with each other and play a part in the fault location calculation. For instance, on a single protected line having two relays at both ends of the line, information about the power signal on the line can be obtained from both relays and then used to make fault location determinations. This is referred to generally as double-ended fault location. This method significantly improves the accuracy of the fault location information relative to single-ended (single relay) methods, but requires both the communication of a significant amount of data from the remote relay and phase alignment of the data (referred to as data sets) between the local and the remote relays (both ends of the line).

The communication of data adds a significant amount of time to fault location, such that it cannot be done in real time, a significant operational disadvantage. Aligning the data can be accomplished by several methods, including aligning (synchronizing) the sampling clocks in each relay with a single time source (such as from a satellite) or using one relay as a reference and synchronizing the other relay thereto, but such methods add time and expense to the overall system. Furthermore, maintaining the synchronization over a period of time is typically difficult and the resulting alignment is still often not completely accurate.

Unfortunately, however, conventional double-ended fault locating systems also have significant disadvantages. One disadvantage which affects single-ended calculations, but also affects double-ended systems using phase quantities, involves the effect of zero sequence mutual coupling in parallel line applications. If the calculations include phase voltage values, which include zero sequence quantities, mutual coupling of the zero sequence quantity between the faulted line and a parallel line will result in inaccuracies in the resulting fault location determination. As the distance increases from the relay making the calculation to the fault, the error becomes more significant. Attempts to compensate for zero sequence mutual coupling typically add significant complexity to the relay design and to the overall protection approach.

Another significant disadvantage to conventional double-ended systems, mentioned briefly above, involves the communication of the data from a remote terminal (relay) to the local terminal making the fault location determination. Typically, a large amount of data must be transmitted from the remote terminal, usually involving a complete event report record following the initial recognition of a fault. An event report is a conventional term meaning a complete set of voltage, current and other data for the power signal, covering a time span of shortly before the fault to the end of the power interruption.

The information in the event report is quite substantial and comprises the data set which must be transmitted to the local terminal and then aligned with the local data set. Typically, this data set will include voltage and current information for all three phases of the power signal. This is a significant amount of data and requires a substantial amount of time to transmit, resulting in a significant delay for the fault location determination to be made by the local relay following initiation of the fault. This delay can have a significant effect on the overall desired operation of the power system.

Once the remote data is received, it must be aligned, as indicated above. If the alignment includes pre-fault data, that pre-fault data must be valid. If the alignment includes fault data, then the computational burden is higher because an iterative calculation method must be used.

Accordingly, it is desirable to have a double-ended fault-locating system which is capable of providing accurate fault location information and to accomplish the fault location determination in substantially real time, with minimum computational burden. It is also desirable that such a system could operate with additional terminals on the line (multi-ended).

DISCLOSURE OF THE INVENTION

Accordingly, the present invention is a system for locating a fault on a power line having first and second terminals thereon, comprising: means for obtaining selected information concerning the power signal on the power line at each of the terminal locations at the time the fault occurs, including the magnitude value of the negative sequence currently and the magnitude and angle values of the negative sequence impedance; and means for determining the fault location point on the power line from the selected information.

BRIEF DESCRIPTION OF THE INVENTION

FIGS. 2 and 3 are a system diagram (FIG. 2) and a data table (FIG. 3) showing the operation results of an alternative embodiment of the present invention.

FIGS. 4, 5 and 6 are a system diagram (FIG. 4) and two graphs (FIGS. 5 and 6) showing results of the embodiment of FIG. 1.

BEST MODE FOR CARRYING OUT THE INVENTION

Figure 1:
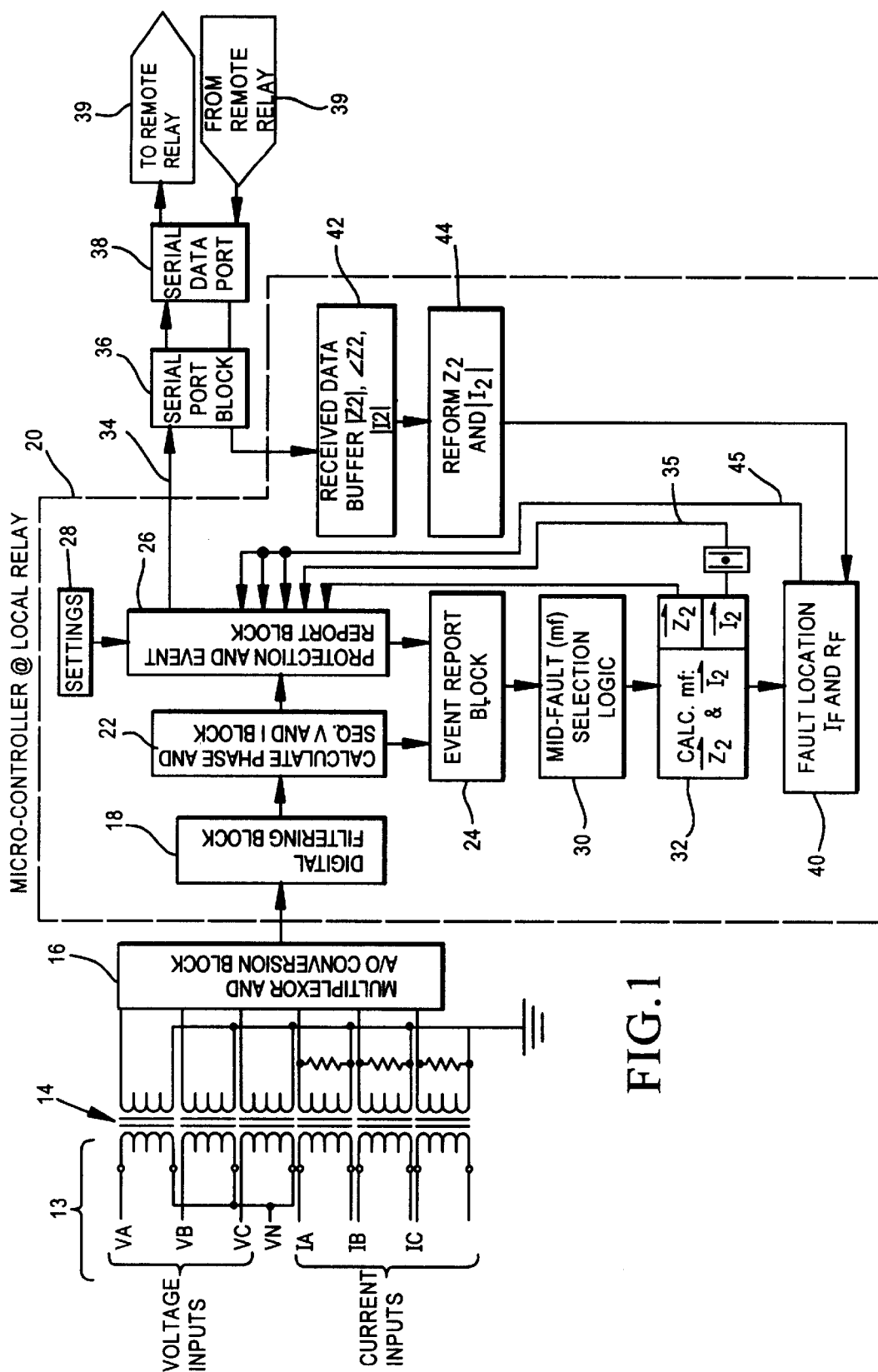
FIG. 1 is a block diagram of the system of the present invention.

One embodiment of the present invention is shown in FIG. 1. The significant aspect of the present invention is that ground faults are located by using only selected negative sequence quantities from all the line ends, wherein the selected negative sequence data does not require alignment with the local relay data. For instance, for a single line, negative sequence quantities are used from the two protective relays on the line between which the fault occurs.

By using negative sequence quantities instead of phase voltage for the various phases, which includes a zero sequence quantity, the inherent system difficulties associated with zero sequence mutual coupling are eliminated. Further, negative sequence source impedance and current (absolute value) quantities do not require alignment of the data sets for two-terminal (double-ended) power lines, i.e. alignment of the remote terminal data to the local terminal data. The equations used for determining the fault location in the present invention use only those specific quantities from the remote terminal which do not require alignment with similar quantities from the local terminal. As mentioned above and discussed further herein, the two quantities are $|I_2|$ (absolute value) and a calculated value of negative sequence source impedance $Z_2$.

As is known, the voltage at the fault on a faulted line is equal when viewed from both ends of the protected line. Hence, at a relay S (local source) at one end of the line:

$$V_{2F} = I_{2S} \cdot (Z_{2S} + m \cdot Z_{2L}) \tag{1}$$

where $V_{2F}$ is the negative sequence fault voltage, $I_{2S}$ is the negative sequence source current, $Z_{2S}$ is the local negative sequence source impedance, m is the per unit distance to the fault from relay S, and $Z_{2L}$ is the negative sequence line impedance (the impedance of the entire protected line between relays S and R). At a relay R (remote) at the other end of the line:

$$V_{2F} = I_{2R} \cdot (Z_{2R} + (1-m) \cdot Z_{2L}) \tag{2}$$

where $I_{2R}$ and $Z_{2R}$ and the negative sequence current and impedance at the remote terminal. Since equations (1) and (2) produce equal results, i.e. $V_{2F}$ at relay S equals $V_{2F}$ at relay R, the two equations 1 and 2 can be combined and rearranged as follows:

$$I_{2R} = I_{2S} \cdot \frac{(Z_{2S} + m \cdot Z_{2L})}{(Z_{2R} + (1-m) \cdot Z_{2L})} \tag{3}$$

As indicated above, it is not necessary to align the relay S and relay R data sets, i.e. the data from the two relays, to determine the fault location, because only magnitudes of the selected negative sequence various values are used (no angle values). Hence:

$$|I_{2R}| = \left| I_{2S} \cdot \frac{(Z_{2S} + m \cdot Z_{2L})}{(Z_{2R} + (1-m) \cdot Z_{2L})} \right| \tag{4}$$

$$|I_{2R}| = \frac{|I_{2S} \cdot (Z_{2S} + m \cdot Z_{2L})|}{|Z_{2R} + (1-m) \cdot Z_{2L}|} \tag{5}$$

$$|I_{2R}| = \frac{|(I_{2S} \cdot Z_{2S}) + m \cdot (I_{2S} \cdot Z_{2L})|}{|(Z_{2R} + Z_{2L}) - m \cdot (Z_{2L})|} \tag{6}$$

To simplify the above equation 6, the following arbitrary variables can be used, with each of the variables having a real and an imaginary part:

$I_{2S} \cdot Z_{2S} = a + jb$ $I_{2S} \cdot Z_{2L} = c + jd$ $Z_{2R} + Z_{2L} = e + jf$ $$Z_{2L} = g + jh$$

Using the above variables and substituting into equation (6) results in the following expression:

$$|I_{2R}| = \frac{|(a+jb) + m \cdot (c+jd)|}{|(e+jf) - m \cdot (g+jh)|} \qquad (7)$$

Equation (7) can then be rearranged as follows:

$$|I_{2R}| = \frac{|(a+mc) + j \cdot (b+md)|}{|(e-mg) + j \cdot (f-m \cdot h)|} \qquad (8)$$

The values on both sides of the equation are then squared:

$$|I_{2R}|^2 = \frac{(a+mc)^2 + (b+md)^2}{(e-mg)^2 + (f-mh)^2} \qquad (9)$$

Expanding equation (9) and rearranging provides the following series of expressions:

$(a+m \cdot c)^2 + (b+m \cdot d)^2 = |I_{2R}|^2 \cdot [(e-m \cdot g)^2 + (f-m \cdot h)^2]$ $m^2 \cdot (c^2+d^2) + 2 \cdot m \cdot (a \cdot c + b \cdot d) + (a^2+b^2) = |I_{2R}|^2 \cdot [m^2 \cdot (g^2+h^2) - 2 \cdot m \cdot (e \cdot g + f \cdot h) + (e^2+f^2)]$ $m^2[|I_{2R}|^2(g^2+h^2)-(c^2+d^2)] + m[-2|I_{2R}|^2(eg+fh)-2(ac+bd)] + [|I_{2R}|^2(e^2+f^2)-(a^2+b^2)]$ The last equation above has the form of a quadratic equation $A \cdot m^2 + B \cdot m + C = 0$, where A, B and C are variables, and m is the per unit distance to the fault. The last equation can be simplified by setting A, B and C as equal to certain selected values in the equation as follows:

$A = |I_{2R}|^2(g^2+h^2) - (c^2+d^2)$ $B = 2|I_{2R}|^2(eg+fh) - 2(ac+bd)$ $C = |I_{2R}|^2(e^2+f^2) - (a^2+b^2)$

The above rearrangement fits into the general quadratic equation, as follows:

$$m = \frac{-B \pm \sqrt{B^2 - 4AC}}{2A} \qquad (10)$$

where again m is the key quantity, the per unit value for the fault location between the two terminals, with relay S being the reference. Because of the plus and minus quantities in the quadratic equation, there are thus two possible fault locations in the solution, one of which is realistic, the other of which is not very probable. Once the value of m is known, a simple calculation involving the m value and the total line distance between the two relays provides the distance to the fault from the local relay S, which makes the calculation.

As can be seen, the only information which must be sent by the remote relay for a two-terminal (double-ended) application are the following negative sequence quantities:

$|I_2|$, $|Z_{2source}|$ and $\angle Z_{2source}$

The above information is transmitted from the remote relay R and used with similar information from the local relay S to make the fault location determination. This is substantially less data than is necessary for conventional double-ended fault location systems. Accordingly, the determination of fault location with the present invention can be made substantially in real time. This results in considerable possible improvement in the operation of the protective system, including significant improvement in reclosing operations.

FIG. 1 shows a basic block diagram of a system for carrying out the above process to determine fault location. In FIG. 1, the focus is the local relay S, with information provided from a remote relay R. However, the calculation could be carried out at the remote relay as well.

Voltage and current values are obtained from the power line by the local relay S. All three phases of voltage, $V_A$, $V_B$ and $V_C$, are obtained from the power line, as well as three phases of current, $I_A$, $I_B$ and $I_C$. This is shown generally at 13 in FIG. 1. These values are too high to process directly, and so they are applied to a group of transformers 14, where they are reduced substantially to levels which can be processed. From transformer group 14, the voltage and current values are applied to a multiplexer and A–D conversion circuit 16. The output of multiplexer/A-D converter 16 is applied to a digital filter 18. The digital filtering is carried out in a microcontroller, shown generally at 20, in the local relay S.

It should be understood that the apparatus for obtaining the voltage and current values from the power line, as well as the transformers 14 and the multiplexer/A–D converter 16 are conventional and are therefore not discussed in detail. The same is true for the digital filter 18.

From digital filter 18, the resulting filtered information is applied to a calculation block 22, in which the phase magnitude and angle are calculated for each of the voltage and current values from the filter 18. In turn, the sequence voltage and current quantities are calculated from the phase quantities. The output of calculation block 22 is then applied to what is referred to as an event report block 24. In event report block 24, the information from calculation block 22 is first formatted into the form of a conventional event report. This information is then continuously circulated in a buffer memory which is part of event report block 24.

Another input to event report block 24 is from a protection and event report trigger block 26. Block 26 is also responsive to the phase magnitude and angle of the voltages and currents from filter block 18 as well as the settings from block 28. The settings are established by the user of the relay, such as through front panel inputs or serial port commands. The measured voltage and current values from filter 18 are compared against the pre-established setting values in the protection portion of the protection and event trigger block 26. Any resulting fault determination made by block 26 is applied to the event report block 24 as a "trigger" signal. The trigger signal indicates that the data circulating in the buffer at that point in time needs to be stored, since it covers the time around the origin of the fault condition. This stored information becomes the event report.

At this point, the conventional protective actions of the relay are initiated, including opening of one or more circuit breakers; the fault location determination is also initiated.

The information in the event report from block 24 is then applied to a mid-fault selection logic block 30, which determines the value of the voltages and currents at a point in time approximately mid-duration of the fault. This step assures accurate fault data. Voltages and currents at the start of the fault are likely to be unsettled, while voltages and currents at the end of the fault are likely to be affected by operation of the circuit breaker. Development of the event report in block 24 and identification of mid-fault information are generally routine operations and are therefore not discussed in additional detail.

The mid-fault information from block 30 is then applied to a calculate block 32, in which the important power quantities in the system of the present invention, namely, negative sequence impedance $Z_2$ and negative sequence current $I_2$ are calculated. As indicated in block 30, the $Z_2$ and $I_2$ values are initially in the form of phasors (polar coordinate quantities). The $Z_2$ value is applied back to protection and event report trigger block 26 in the form of a magnitude and angle, along with the absolute value of the negative sequence current $|I_2|$, on lines 33 and 35, respectively. Block 26 then sends out that information on output line 34, through a serial port block 36. Typically, serial port block 36 is a universal asynchronous receive-transmit device (UART). The output from UART 36 is applied to a data port 38 and from there transmitted to the remote relay R over a suitable communication line, shown generally at 39.

The calculated $Z_2$ and $I_2$ values from block 32 are applied at one input to a fault location calculation block 40, which determines the value of m in accordance with the calculations discussed above. Calculation block 40 in the embodiment shown determines the value of m, and the actual fault location in physical distance from relay S, as well as total fault current ($I_F$) and fault resistance ($R_F$). The determination of the m value was discussed above in detail; the determination of $I_R$ and $R_F$ will be discussed hereinafter.

As discussed above, the present system is double-ended, i.e. it uses information from the remote terminal (in addition to the local terminal) to make fault determinations. Hence, $Z_2$ and $|I_2|$ are transmitted from the remote relay, or more specifically, $|Z_{2R}|$, $\angle Z_{2R}$ and $|I_{2R}|$. This information is received from the remote relay over communication line 39, through data port 38, then through UART 36 and into a receive data buffer 42.

The buffer 42 temporarily stores the data and then directs it to a "reform data" block 44, which in the embodiment shown reconstitutes the transmitted data which has been sent bit by bit into a data stream, i.e. it puts the data back together in its original byte form. The information from block 44 is then applied as another input to calculate block 40. Thus, calculate block 40 uses negative sequence values from both ends of the line (local relay S and remote relay R) to determine fault location. The fault location information is then applied back to protection block 26 on line 45, from where it is sent back over output line 34 back to the remote relay and also to appropriate display or other devices.

The calculation of the m value and the fault location can be done in substantially real time, because the required information from the remote relay can be obtained very quickly and the required calculations also accomplished quickly. Further, by using negative sequence source values, the angle values between $V_2$ and $I_2$ basically cancel out, so that there is no need for aligning, i.e. synchronizing, the data set information from the remote relay with the data set information at the source (local) relay.

The system described above is generally preferred because one transmission of a relatively small amount of data and a single calculation is all that is necessary to obtain the desired fault information. However, it should be understood that there are alternative methods of fault determination using the selected negative sequence quantities. One such alternative, described below, has many of the advantages of the above-described embodiment, but requires additional time for computation of the fault location, due to a plurality of information exchanges with the remote relay.

As discussed above, fault voltage $V_{2F}$ for negative sequence quantities (as well as positive and zero sequence quantities) are equal when viewed from both ends of the protected line. To repeat, at source relay S:

$$V_{2F}=I_{2S}\cdot(Z_{2S}+m\cdot Z_{2L}) \quad (11)$$

and at relay R:

$$V_{2F}=I_{2R}\cdot(Z_{2R}+(1-m)\cdot Z_{2L}) \quad (12)$$

In this alternative embodiment, an initial value of m, e.g. 0.5, is selected by the calculation block. $V_{2F}$ is then calculated for both relay S and relay R with equations 11 and 12 using that value of m, along with the calculated negative sequence values of $I_{2S}$ and $V_{2S}$ and $I_{2R}$ and $V_{2R}$ and the known value of $Z_{2L}$. The values of $|V_{2F}|$ for $|V_{2S}|$ and $|V_{2R}|$ are then compared, i.e. $|V_{2FS}|-|V_{2FR}|$. If the resulting $\Delta V_F$ is negative, the initial value of m is thus too small, i.e. m is greater than 0.5 for the calculated values of current and impedance at the time of the fault.

Assuming the initial determination is negative, the next selected value is m=0.75, halfway between 0.5 and 1.0. The same calculation and comparison is then performed. With each successive iteration, the resulting $\Delta V_{2F}$ will converge toward zero. When $\Delta V_{2F}$ is zero, the selected m value at that point is the true m value. An example using this method is shown in the table of FIG. 2 for a selected fault condition, shown in FIG. 3. FIG. 3 sets out event report information for a particular fault on a particular system. It should be understood that the information therein for positive sequence values will be identical for negative sequence values. As can be seen, the process of FIG. 1 took seven iterations to reach the correct value of m=0.6. While the iterative strategy in the above example is to select an m value halfway between previous values, other iteration strategies can be selected. The primary disadvantage to this embodiment, however, is that it is time-consuming, i.e. it requires several successive calculations. In the preferred embodiment, only one calculation is necessary.

FIG. 4 shows a two-terminal, nearly homogeneous system. By homogeneous is meant that source S, source R and the transmission line have the same phase angle. In a typical non-homogeneous system, the phase angles of the two sources will differ significantly, typically greater than 5°. FIGS. 5 and 6 show the difference in fault location accuracy between the system of the present invention and previous single-ended systems for a 100-mile line between relays 60 and 62. In FIG. 5, for the system of FIG. 4, a fault occurs at point 64, 25 miles from relay 60. Line 66 in FIG. 5 indicates the calculated determination produced by the present invention that the fault occurred very close to 25 miles from relay 60. Conventional single-ended fault determination, indicated by line 68, would have provided a location of approximately 23.75 miles, which is a substantial difference from the actual fault location. The single-end system error increases with distance. If the calculation was made from the other end, the present invention would come very close to the ideal answer of 75 miles, while conventional single-ended methods would produce a result of 85 miles, a substantial error.

FIG. 6 shows results for a fault in the system of FIG. 4 at point 70, 50 miles along the line. Line 72 shows the results of the present invention, while line 74 shows the results of the conventional single-ended determination.

The large possible error using conventional determinations is very significant, since it would tend to substantially reduce confidence in the accuracy of the results on the part of line service personnel. Typically, the error with the present invention is less than 1% of the line length. Use of the invention for non-homogeneous EHV (extra high voltage) transmission systems provide similar good results. Accurate results are also achieved using either of the embodiments described above.

Figure 7:
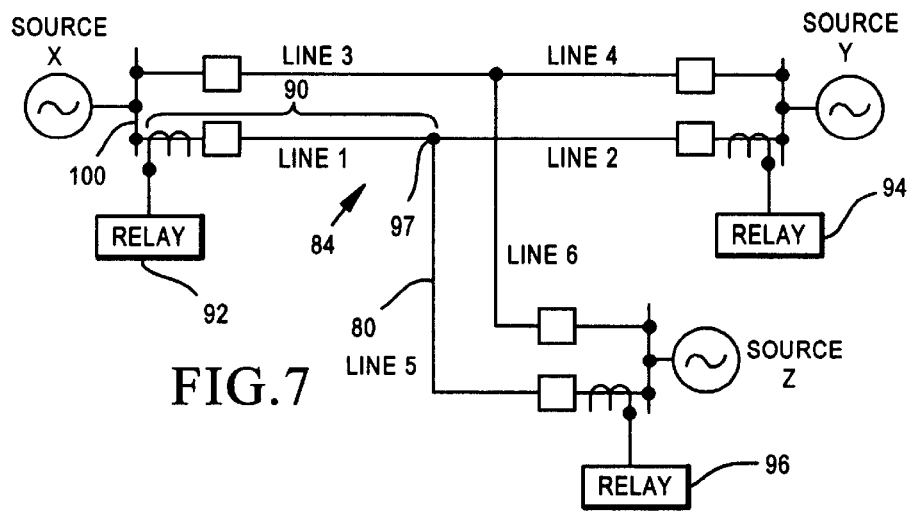
FIG. 7 is a line diagram showing a three-terminal application for the system of the present invention.

Applicants' invention can also be used in a three-terminal line application, such as shown in FIG. 7. Three-terminal line applications are not uncommon in present power systems. Utilities will connect a line 80 (line portion 5) with a source Z to an existing two-terminal line 84 (line portions 1 and 2) with two sources Y and X, creating a three-terminal line, meaning a line with three sources. All three sources contribute to the energy of a fault when a fault occurs. Accurate fault location is more difficult with the more complicated three-terminal application. The system of FIG. 7 also includes a parallel line arrangement (line portions 3, 4 and 6), to illustrate a typical field situation.

If single-ended fault locating devices are located at each line end, the most accurate fault location will be provided by that relay whose line section is not in parallel with another line section during the fault. For instance, if a single-line ground fault occurs on line (line portion 1) 90 in FIG. 7, fault location information from relay 92 is more accurate than fault location information developed by relay 94 or relay 96.

Figure 8:
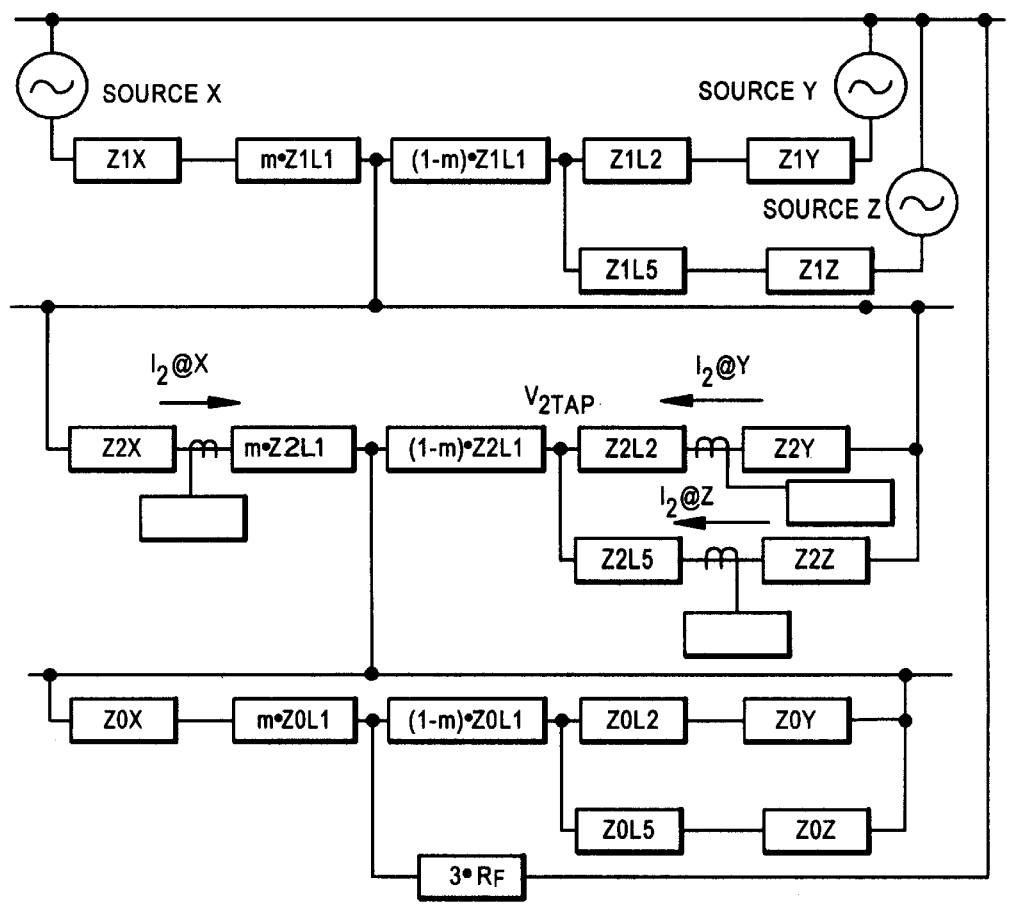
FIG. 8 is a sequence connection diagram for the three-terminal system of FIG. 7.

In the embodiment shown, a more accurate calculation is produced by viewing the three-terminal line in a negative sequence network context. The sequence diagram shown in FIG. 8 is based on a single line-to-ground (SLG) fault located m per unit distance from bus 100, which is connected to a source X. When the fault is at this location, at tap point 97, it is known that relays 94 and 96 will calculate the same values for $V_{2F}$ and $V_{2TAP}$ (the voltages at the tap point 97). Fault location on line portion 90 will be calculated as follows:

@ Relay 92. $V_{2TAP@1} = V_{2@1} - Z_{2L1} \cdot I_{2@X}$

@ Relay 94. $V_{2TAP@2} = V_{2@2} - Z_{2L2} \cdot I_{2@Y}$

@ Relay 96. $V_{2TAP@5} = V_{2@5} - Z_{2L5} \cdot I_{2@Z}$ where the $I_2$ values are at the three sources X, Y and Z, and relays 92, 94 and 96 are referred to as 1, 2 and 5 for the voltage and impedance values.

For faults on line portion 90, $V_{2TAP}$ at relay 94 is equal to $V_{2TAP}$ at relay 96. Each relay calculates $V_{2TAP}$ and transmits it to the other two relays. Once each relay receives the $V_{2TAP}$ voltage from the other relays, the particular $V_{2TAP}$ signal is initially selected which does not have a close match. In the example shown in FIG. 7, for instance, $V_{2TAP}$ at relays 94 and 96 have the closest match.

Figure 9:
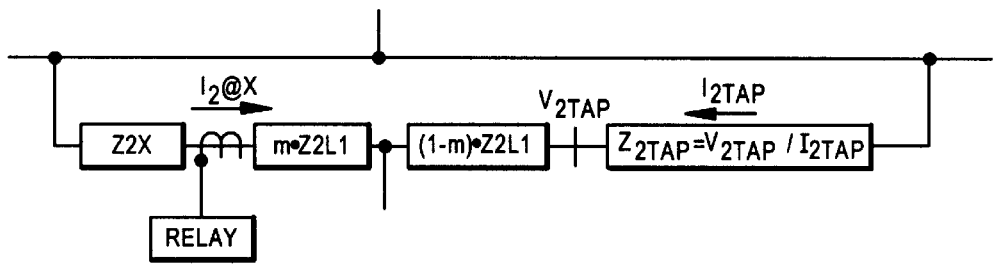
FIG. 9 is an equivalent negative sequence network diagram for FIG. 8.

Once the line portion with the fault is thus identified, the parallel combination of the other two line portions is converted to a single impedance. This conversion is simply $V_{2TAP}/I_{2Y}+I_{2Z}$. However, $I_{2Y}$ and $I_{2Z}$ from relays 94 and 96 cannot be simply added because their sampling clocks are not aligned. Since we know, however, that the angle ($V_{2TAP}$ at relay 92)/($V_{2TAP}$ at relay 96) equals the alignment angle between relays 92 and 96. Once this angle is known, then the negative sequence currents from relays 92 and 96 can be used to calculate an apparent negative sequence source at point 97 (the tap point). A sequence connection diagram for the three-terminal line example of FIG. 7 is shown in FIG. 8. The equivalent negative sequence network diagram is shown in FIG. 9.

In the three-terminal application, the minimal information sent by each relay to each of the other relays is:

1. $|I_{2RELAY}|$
2. $\angle I_{2RELAY}$
3. $|V_{2TAP}|$
4. $\angle V_{2TAP}$

From these quantities, each relay will perform the following steps before the fault location is calculated. First, the magnitudes of $V_{2TAP}$ calculated by each relay are compared. The two relays which have approximately the same $V_{2TAP}$ are those not associated with the faulted line portion. These relays are referred to herein as remote relays 1 and 2. From the respective angles of $V_{2TAP}$ for remote relays 1 and 2, the alignment angle between those two relays is determined. The relay having the $|I_{2relay}|$ value is used as the reference relay. The angle of the non-reference remote relay negative sequence current is then adjusted by the alignment angle determined above. The negative sequence current of the reference remote relay in then added to the angle adjusted negative sequence current of the non-reference remote relay. This value is referred to as $I_{2TAP}$. $Z_{2TAP}$ is then calculated as $V_{2TAP}/I_{2TAP}$.

The quadratic equation calculation described above or the two-terminal line is once again applicable, with the following substitution for a three-terminal line of $Z_{2TAP}+Z_{2L}=e+jf$ and $I_{2R}=I_{2TAP}$.

Each of the three relays can calculate an accurate m value, because they all have the required data. The system of the present invention can thus in substantially real time perform an accurate fault location determination on three terminal lines as well. This is a tremendous advantage over existing fault location systems.

Once the fault location information is known, then the fault resistance ($R_F$) can be calculated. This is an added feature for the system of the present invention. Generally, the fault resistance is unknown, even though its value can be used to determine how sensitive to set the protective relays for a particular line configuration. Currently, the settings are done conservatively, without knowledge of the fault resistance. Accurate knowledge of fault resistance history for previous faults on a line can improve the accuracy of protection settings (distance and directional ground fault) for the line. Besides being useful for establishing distance and directional ground fault sensitivity, fault resistance values can also be used for tracking the greatest fault resistance which has occurred in the past on a particular protected line. This is useful for fault studies by protection engineers.

In calculating fault resistance $R_F$, such as for example in an A-to-ground fault located an m per unit distance value from the relay, the A phase voltage measured by the relay can be represented as:

$$V_A = m \cdot Z_{1L} \cdot (I_{AS} + k_0 \cdot I_R) + R_F \cdot I_F \tag{13}$$

The $R_F$ term is the term of interest. To solve for $R_F$, for A phase ($R_{AF}$), all of the other terms in the equation are multiplied by $(m \cdot Z_{1L} \cdot (I_{AS} + k_0 \cdot I_R))^*$, saving the imaginary terms, as shown:

$$R_{AF} = \frac{\text{Im}[V_A \cdot (Z_{1L} \cdot (I_A + k_{0F} \cdot I_R))^*]}{\text{Im}[I_A \cdot (Z_{1L} \cdot (I_A + k_{0F} \cdot I_R))^*]} \tag{14}$$

where: $I_{AF} \equiv I_{TOTAL}$ through $R_F$ for an A phase-ground fault. The quations for B and C phase-to-ground faults are similar to that shown above for A-ground.

Now, to calculate $I_{TOTAL}$, the fault location, local and remote source information and the replica line impedance is used as follows:

$$I_{2S} = I_{TOTAL} \cdot \frac{[(1-m) \cdot Z_{2L} + Z_{2R}]}{[Z_{1S} + Z_{1L} + Z_{1R}]} \tag{15}$$

Now, solving for $I_{TOTAL}$ (the total current through the fault resistance $R_F$), $$I_{TOTAL} = I_{2S} \cdot \frac{[Z_{2S} + Z_{2L} + Z_{2R}]}{[(1-m) \cdot Z_{2L} + Z_{2R}]} \quad (16)$$

where $Z_{1L}$ and $Z_{2L}$ are replica line impedance quantities.

For three-terminal line applications, $Z_{2TAP}$ is substituted for $Z_{2R}$ in equation 16. The above system has been proven to be quite effective in calculating an accurate value of $R_F$ and $I_{TOTAL}$.

In the past, voltages and currents on power transmission lines have been balanced by periodically transposing the location of each of the individual transmission lines (one for each phase) relative to ground beneath the lines. This was done in order to balance the phase lines. Transposing of the individual phase lines involves changing the relative position of each phase line relative to the ground at selected distance intervals along the line, i.e. the physical positions of the individual A phase, B phase and C phase lines are regularly rotated between three spaced vertical positions on a transmission line tower. Transposing can also occur between horizontal lines, in which the individual phase lines are regularly rotated between three different horizontal positions on a transmission line tower.

However, transmission lines typically are not transposed under current practice, because it has been discovered that a substantial percentage of transmission line faults occur at the transposition points. The lack of transposition does reduce faults; however, it also results in unbalanced lines, and in errant negative sequence and zero sequence current flow for normal loads as well as in faults. In such a case, the magnitude and angle of both $I_{A2}$ and $I_{A0}$ (negative sequence and zero sequence currents) differ from that calculated by traditional steady-state fault studies. The non transposition of the power line can cause possible fault location errors in those fault location systems using negative sequence line impedance quantities.

Consideration of and compensation for the effects caused by non transposition are not accounted for in existing fault location systems. While the errant unbalanced currents can be quite a complicated situation, the effects thereof can generally be compensated for by subtracting the pre-fault negative sequence current value from the fault-generated negative sequence current to produce a resulting negative sequence current. In the above equations, the resulting negative sequence current is simply substituted for $I_{A2}$. If the line is symmetrical, the pre-fault $I_2$ is always zero.

The multi-ended fault locator system of the present invention thus produces an output indicating the fault location as well as fault resistance ($R_F$) and total fault current ($I_F$). The fault location information, of course, has immediate use for system operators in directing line crews to the right location along the line for repair. Accurate information, as explained above, is quite important for system operation, as well as the morale and confidence of the repair crews, particularly in difficult terrain.

However, real time accurate fault location information can also be useful in other applications, notably the control of breakers and/or switches on the faulted line.

Figure 10A:
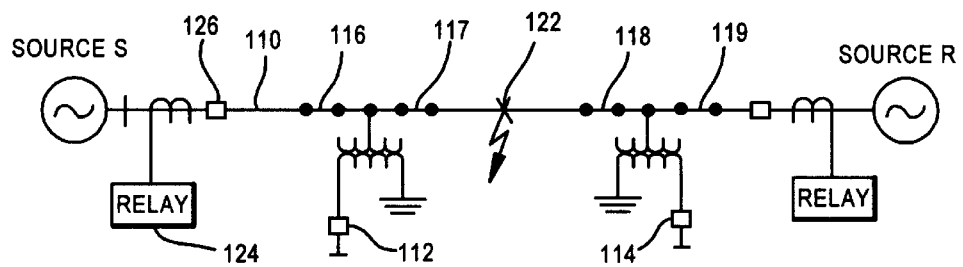
FIGS. 10A, 10B and 10C are diagrams showing use of the system of the present invention in controlling switches on a faulted power line.
Figure 10B:
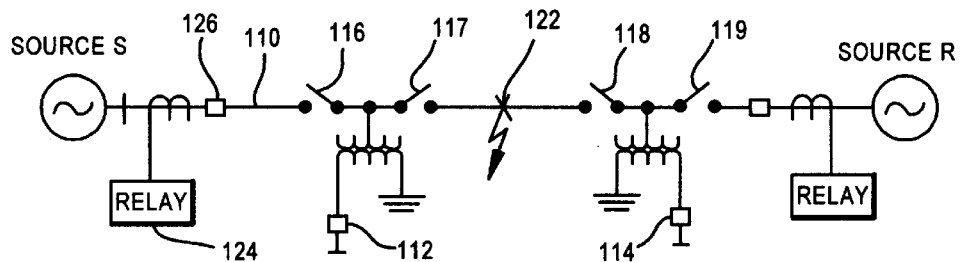
Figure 10C:
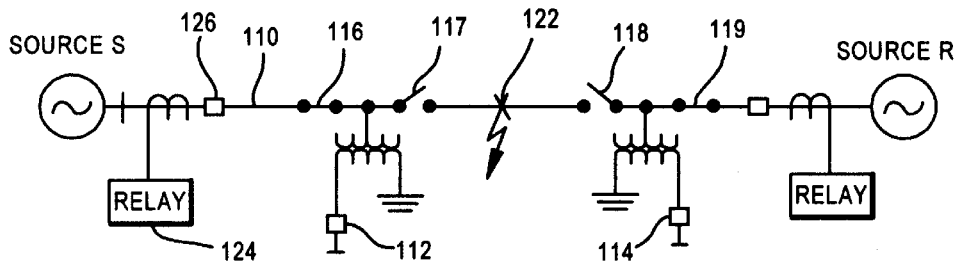

FIGS. 10A, 10B and 10C show a protected line 110 involving loads 112 and 114 and switches 116–119. In this example, a fault occurs mid-line, at point 122.

Under traditional line control techniques, switches 116–119 will all be opened in response to voltage on either side of the switches being near zero for a set time, which occurs for instance when a relay 124 trips the circuit breaker 126 due to the fault. A conventional reclosing scheme will ultimately result in switch 116 being open for some time when that is not actually necessary in response to the fault. In this case, the customers serviced by load 112 are unnecessarily penalized.

In the present invention, the fault location information produces an output to comparator logic within relay 124. Relay 124 will compare the fault location information against two thresholds which are representative of the distance between switches 117 and 118. If the fault location is within the two thresholds, relay 124 will send trip commands to switches 117 and 118. The result is that loads 112 and 114 are restored very quickly. Other examples of use of the accurate fault location in power system protection schemes will be readily apparent to those skilled in the art.

Hence, a system of fault location has been described and shown which uses negative sequence quantities, in particular $|I_2|$ and $Z_2$ (magnitude and angle). The system not only overcomes a number of disadvantages of present systems, it also has the advantage of providing results substantially in real time, due to a relatively small exchange of information from the remote terminal. Further, the system can be used for fault location on three-terminal lines as well. It is thus a significant development in the area of fault locators for multi-ended systems.

Although a preferred embodiment of the invention has been disclosed herein for illustration, it should be understood that various changes, modifications and substitutions may be incorporated in such embodiment without departing from the spirit of the invention, which is defined by the claims as follows.

What is claimed is:

1. A system for locating a fault on a power line having first and second terminals thereon, the second terminal being remote from the first terminal along the line, comprising:

means for obtaining selected information concerning the power signal on the power line at each of the terminal locations at the time the fault occurs, including the magnitude value of the negative sequence current and the magnitude and angle values of the negative sequence impedance;

means for transmitting said selected information obtained at the second terminal back to the first terminal; and means for automatically determining the fault location point on the power line from the selected information obtained at the first and second terminals.

2. A system of claim 1, wherein the determining means includes means for calculating a fractional value m of the total power line length where the fault occurs and then using the value m and the known length of the power line to determine a distance point along the power line where the fault occurs.

3. A system of claim 2, wherein the calculations of m is based on the following expression comprising first and second equivalent equations for negative sequence fault voltage $V_{2F}$:

$$I_{2S}(Z_{2S}+m \cdot Z_{2L}) = I_{2R}(Z_{2R}+[1-m]Z_{2L}) = V_{2F}$$

where $I_{2S}$ equals the negative sequence current at a local terminal on the power line where the m calculation occurs, $Z_{2S}$ equals the negative sequence impedance at the local terminal, $I_{2R}$ equals the negative sequence current at a remote terminal on the power line, and $Z_{2R}$ equals the negative sequence impedance at the remote terminal, and wherein $Z_{2L}$ is the negative sequence impedance of the power line between the two local and remote terminals.

4. A system of claim 3, wherein the calculation of m involves arranging the said negative sequence current and impedance information into a quadratic equation form and solving said quadratic equation for the value m.

5. A system of claim 2, wherein the power line has a double-ended configuration.

6. A system of claim 2, wherein the selected information concerning the power signal is obtained approximately at a mid-fault point in time.

7. A system of claim 2, including means for obtaining voltage and current information for all three phases on the power transmission line and means for circulating that information in a buffer memory and further including means responsive to an indication of a fault on the power line to temporarily store said voltage and current information over the approximate duration of the fault.

8. A system of claim 7, wherein the determining means uses said voltage and current information to produce the negative sequence current and impedance values.

9. A system of claim 2, including means for transmitting the negative sequence current and the negative sequence impedance magnitude and angle to the remote terminal in substantially real time.

10. A system of claim 2, wherein the power line has three terminals, associated with three power line portions, and including means for adjusting the determination of fault location to account for said three terminals.

11. A system of claim 10, wherein the means for adjusting includes means for determining which one of the power line portions does not have a match in voltage value at a tap point where the three power line portions join, and means for converting the remaining two line portions to a single impedance value.

12. A system of claim 2, wherein the calculation means includes means for automatically selecting successive values of m and solving the first and second equations until the results thereof are substantially equal.

13. A system of claim 2, including means for calculating the value of fault resistance ($R_F$) from the fault location information.

14. A system of claim 13, including means using the value of fault resistance to calculate the total fault current $I_{TOTAL}$.

15. A system of claim 1, wherein the first terminal is a local terminal determining the said fault location point and the second terminal is a remote terminal, and wherein the selected information from the remote terminal is not aligned with the selected information from the local terminal.

16. A system of claim 1, including means responsive to the fault location information for influencing the operation of a protection system for the power line.

* * * * *